United States Patent [19]

Kapoor

[11] Patent Number: 5,698,468
[45] Date of Patent: Dec. 16, 1997

[54] SILICIDATION PROCESS WITH ETCH STOP

[75] Inventor: Ashok K. Kapoor, Palo Alto, Calif.

[73] Assignee: LSI Logic Corporation, Milpitas, Calif.

[21] Appl. No.: 486,803

[22] Filed: Jun. 7, 1995

[51] Int. Cl.$^6$ .................................................. H01L 21/44
[52] U.S. Cl. ................... 437/200; 437/192; 437/228 ES
[58] Field of Search ................................. 437/192, 200, 437/228 ES, 247

[56] References Cited

U.S. PATENT DOCUMENTS

| | | | |
|---|---|---|---|
| 4,881,105 | 11/1989 | Davari et al. | 257/334 |
| 5,223,081 | 6/1993 | Doan | 437/200 |
| 5,275,715 | 1/1994 | Tuttle | 437/192 |
| 5,288,666 | 2/1994 | Lee | 437/200 |
| 5,316,977 | 5/1994 | Kunishima | 437/200 |
| 5,434,096 | 7/1995 | Chu et al. | 437/247 |

OTHER PUBLICATIONS

Wolf, Silicon Processing for the VLSI Era, vol. 2: Process Integration, Lattice Press, pp. 144–147, 1990.

*Primary Examiner*—John Niebling
*Assistant Examiner*—Kevin F. Turner
*Attorney, Agent, or Firm*—Fenwick & West LLP

[57] ABSTRACT

A semiconductor processing method forms etch stop layers over semiconductor structures without the need for additional etching, masking, and deposition steps. A refractory metal capable of forming silicides and oxides under standard processing conditions is deposited over the deposition, oxide, and polysilicon layers of a MOS integrated circuit wafer. The coated wafer is first annealed to form refractory metal silicide layers over the unoxidized silicon structures. The coated wafer is then oxidized to convert unreacted refractory metal over the oxidized silicon structures into refractory metal oxide etch stops over these structures.

10 Claims, 7 Drawing Sheets

SILICIDATION PROCESS WITH ETCH STOP

BACKGROUND OF THE INVENTION

1. Field of the Invention

This invention relates to the field of fabrication processes for semiconductor technology and the materials produced by such processes. In particular, the invention relates to methods for forming interconnection structures in semiconductor devices that include an etch-stop.

2. Background Art

Integrated circuits are produced from semiconductor materials such as silicon through various well known processes, including epitaxy, oxidation, chemical and physical vapor deposition, photolithography, ion implantation, and metallization. The resulting integrated circuit has a multilayered structure comprising substrate, deposition, oxide, polysilicon, and metallization layers. Modern integrated circuits, which can contain in excess of one million discrete devices, may require multiple levels of metallization to provide the necessary electrical contacts to all devices.

Electrical connections to the drains, sources, polysilicon gates and polysilicon interconnects of MOS devices are formed by etching contact holes through insulating layers deposited over the MOS device components. Metal contacts are then deposited in the etched contact holes, and a metallization layer is deposited over the insulating layer. Since these contact holes are etched following formation of the gates, drains, sources, field oxides, gate oxides and interconnects of the MOS devices, over-etching may destroy these components or create electrical shorts. For example, source and drain regions are typically adjacent to field oxide regions that separate individual MOS devices. If the contact hole for a source or drain is misaligned, the etch will remove material from the adjacent field oxide. If etching of the field oxide is significant, the metal deposited in the next step may create a short to the substrate below the field oxide.

Conventional processing methods eliminate the risk of such over-etching by depositing etch stops over selected components of the MOS devices. An etch stop is a layer of material that is impervious to the etching agent being used in another layer. For example, an etch stop deposited over the field oxide described above prevents the etching agent from removing any field oxide. Particularly in modern, VLSI circuits, where minimum feature sizes are on the order of a micron and the likelihood for misalignment of contacts is correspondingly higher, etch stops are essential to produce reliable integrated circuits with high yields.

Conventional processing methods require additional steps to deposit etch stops over selected portions of the MOS device. These steps are typically implemented following a silicidation process, in which a refractory metal is deposited and annealed to form a conductivity enhancing silicide over the gates, drains, and sources of the devices of the integrated circuit. Following removal of the unreacted refractory metal, an etch-resistant material such as silicon nitride is deposited over the wafer by chemical vapor deposition. An insulating oxide layer is then deposited over the wafer and contact holes are opened using a photoresist mask. As oxide is etched from the contact holes, the underlying nitride layer blocks etching of the field oxide.

The etching and nitride deposition steps increase the time necessary to process integrated circuits and further complicate an already complicated procedure. There is thus a need for a simplified processing technique that allows formation of an etch stop without additional processing steps.

SUMMARY OF THE INVENTION

The present invention is a method for forming etch stop layers in MOS integrated circuits without separate preparatory and material deposition steps and the products formed by this method. In accordance with the invention, a layer of silicide-forming refractory metal is deposited over the deposition, oxide, and polysilicon layers that define the drains, sources, gates and interconnects of the MOS devices forming an integrated circuit. The resulting coated structure is annealed until the silicide-forming refractory metal in contact with the drains, sources, polysilicon gates, and polysilicon interconnects reacts with the underlying silicon to produce layers of the refractory metal silicide over these device components. The silicide-forming refractory metal deposited over the silicon oxide regions of the MOS devices, which does not react to form silicides, is then oxidized to form a refractory metal oxide layer. The refractory metal oxide layer thus forms an etch stop over the underlying silicon oxide regions of the MOS devices, without need for additional processing steps.

DETAILED DESCRIPTION OF THE INVENTION

Figure 1A:
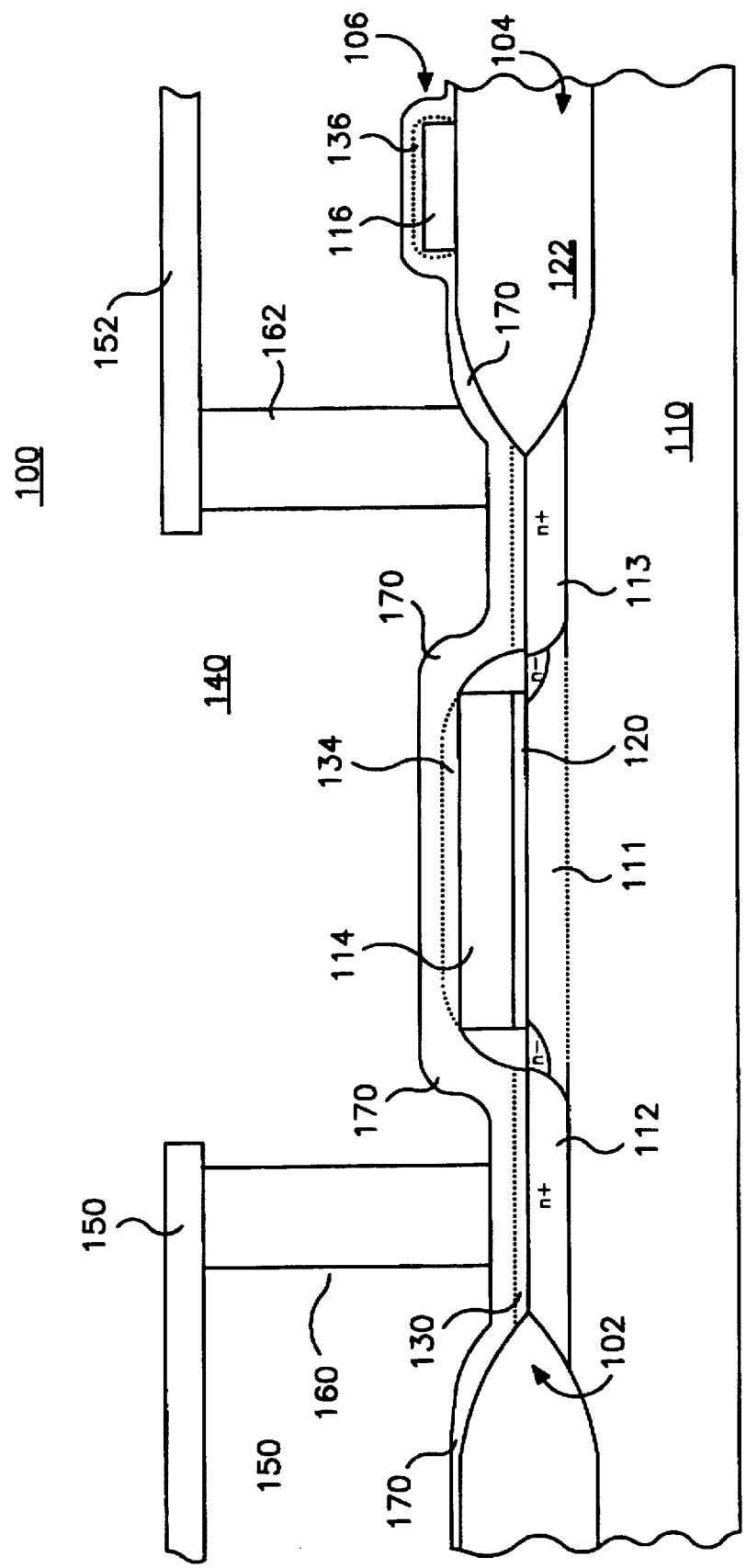
FIG. 1A is a cross-sectional view of a section of an integrated circuit device including an etch stop layer formed by conventional methods.

Referring now to FIG. 1, there is shown a cross sectional diagram of a Metal Oxide Semiconductor (MOS) device 100 manufactured by conventional processes. MOS device 100 comprises a substrate 110 having a deposition layer 102 that has been doped to form a source 112 and drain 113. Lightly and heavily doped regions are indicated as $n^-$ and $n^+$, respectively. A channel 111 between source 112 and drain 113 may or may not be doped. A polysilicon gate 114 is separated from channel 111 by a gate oxide region 120 of silicon dioxide, and a polysilicon interconnect 116 is shown extending over a field oxide region 122 of silicon dioxide. Gate and field oxides 120, 122, respectively, form an oxide layer 104, and polysilicon gate and drain 114, 116, respectively, form a polysilicon layer 106. An insulating layer 140, which is typically silicon dioxide, electrically isolates source 112, drain 113, gate 114, and interconnect 116 from metallization layers 150, 152 which couple device 100 into an integrated circuit through contacts 160, 162, respectively. Metal contact 162 is shown misaligned so that it extends over field oxide region 122.

Silicide layers 130, 132, 134, 136 are included to enhance the conductivity of underlying source 112, drain 113, gate 114, and interconnect 116. Silicide layers 130, 132 also improve the electrical connections of source 112 and drain 113 with contacts 160, 162, respectively. Silicide layers 130, 132, 134, 136 are typically generated by depositing a silicide-forming refractory metal such as Ti over the exposed surfaces of deposition, oxide, and polysilicon layers 102, 104, 106, respectively, and annealing the coated structure.

Annealing allows silicon in source 112, drain 113, gate 114, and interconnect 116 to migrate into the overlying refractory metal to form the corresponding refractory metal silicide layers 130, 132, 134, 136.

The silicon in gate oxide 120 and field oxide 122 does not migrate, leaving the overlying refractory metal unreacted through the annealing step. In conventional processes, this unreacted refractory metal is removed in a subsequent step and an etch stop such as silicon nitride layer 170 is deposited over the wafer. The interfaces between silicide layers 130, 132, 134, 136 and nitride layer 170 are indicated by a dashed lines. Insulator layer 140 is deposited after silicon nitride layers 170, and selectively etched to prepare contact holes for electrical contacts 160, 162. If, as indicated in FIG. 1, the etched region extends beyond the edge of drain 113 silicon nitride layer 170 prevents etching of field oxide 120. Overetching may also occur at source 112 and at electrical contacts to gate 114 and interconnect 116 (the latter two contacts are not shown in FIG. 1A).

Figure 1B:
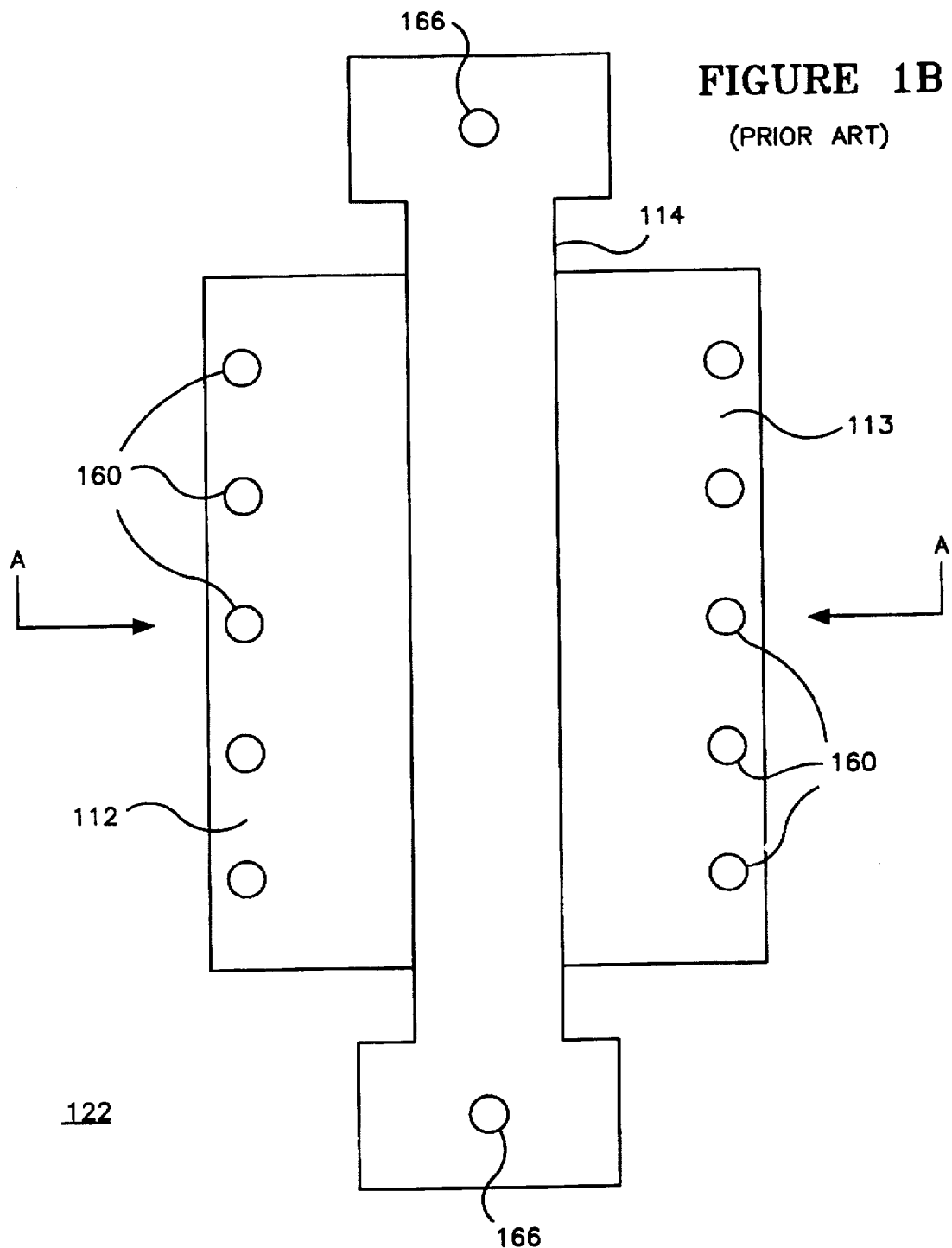
FIG. 1B is a top view of the integrated circuit section of FIG. 1A, without metallization layers 150, 152.

Referring now to FIG. 1B, there is shown a top view of integrated circuit 100, indicating the location of sources 112, drains 113, gates 114, and contacts 160 for a series of devices 100. The position at which the cross-sectional view of FIG. 1A is taken is indicated by the arrows labeled A. In the absence of an etch stop, each electrical contact 160, 162 may lead to shorting if misaligned to impinge on a field oxide. Contacts 166 for gate 114 may lead to similar shorts.

Figure 2A:
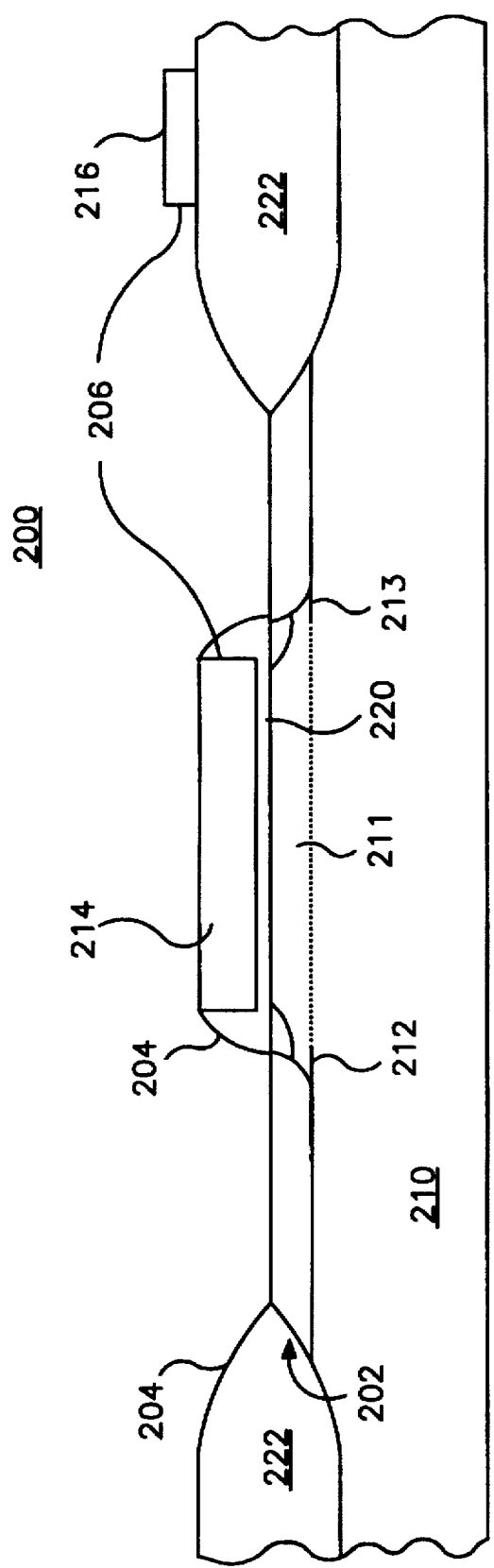
FIGS. 2A–2D are cross-sections of an integrated circuit device in various stages of fabrication by a process in accordance with the present invention.

Referring now to FIGS. 2A–2D, there are shown cross-sectional representations of a series of semiconductor structures 200, 240, 250, 260 at various stages of a fabrication process in accordance with the present invention. Referring first to FIG. 2A, there is shown semiconductor structure 200 following formation of diffusion layer 202, oxide layer 204, and polysilicon layer 206 over substrate 210. As indicated in FIG. 1, diffusion layer 202 comprises source 212 and drain 213 formed by doping substrate 210 and (optionally) channel 211. Oxide layer 204 is typically formed by the LOCOS process. This process is well known in semiconductor manufacturing and is not described in detail here. Gate oxide 220 isolates channel 211 from polysilicon gate 214 and field oxide 222 isolates semiconductor structure 200 from other devices of the integrated circuit. Polysilicon layer 206 comprises polysilicon gate 214 and polysilicon interconnect 216 over gate oxide 220 and field oxide 222, respectively. Diffusion, oxide, and polysilicon layers 202, 204, 206, respectively, may be produced by a number of different well-known processes.

Figure 2B:
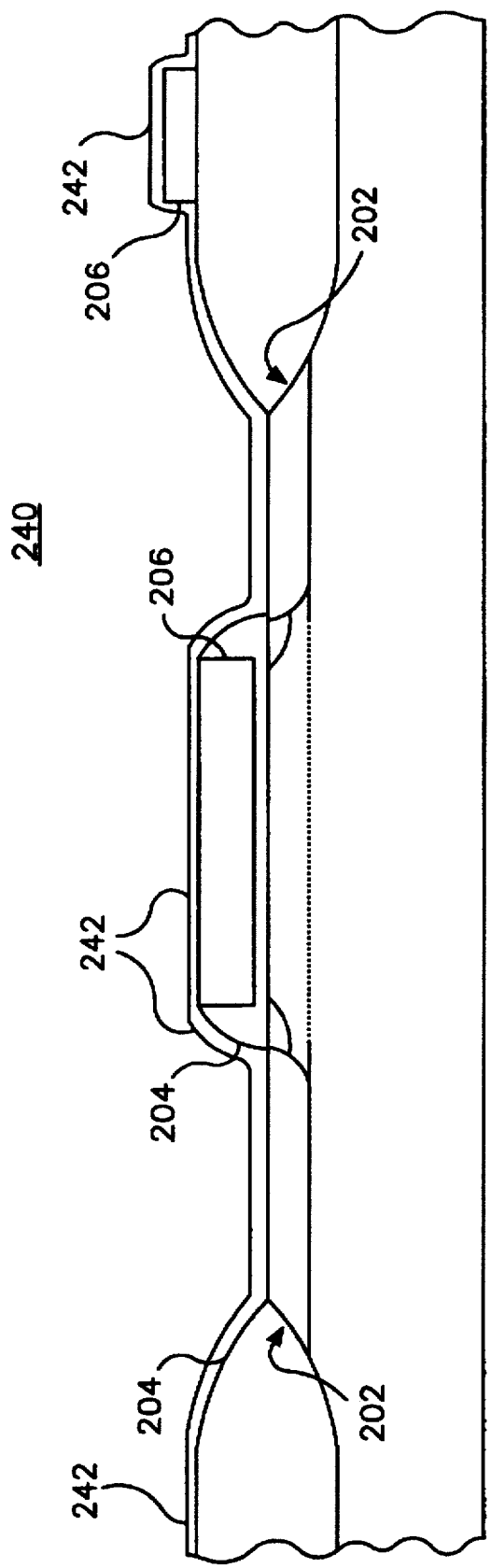

Referring now to FIG. 2B, there is shown a semiconductor structure 240 formed by depositing a silicide-forming refractory metal layer 242 over structure 200. Typically, refractory metal layer 242 is deposited over unheated structure 200 by sputter deposition, although other deposition techniques may be used. The thickness of refractory metal layer 242 is typically between 50 Å and 1000 Å, and, is preferably, in the range 200 Å to 400 Å.

In the preferred embodiment of the present invention, silicide-forming refractory metal layer 242 is titanium. However, cobalt, hafnium, molybdenum, nickel, palladium, platinum, tantalum, tungsten, and zirconium may also be used to form refractory metal layer 242.

Figure 2C:
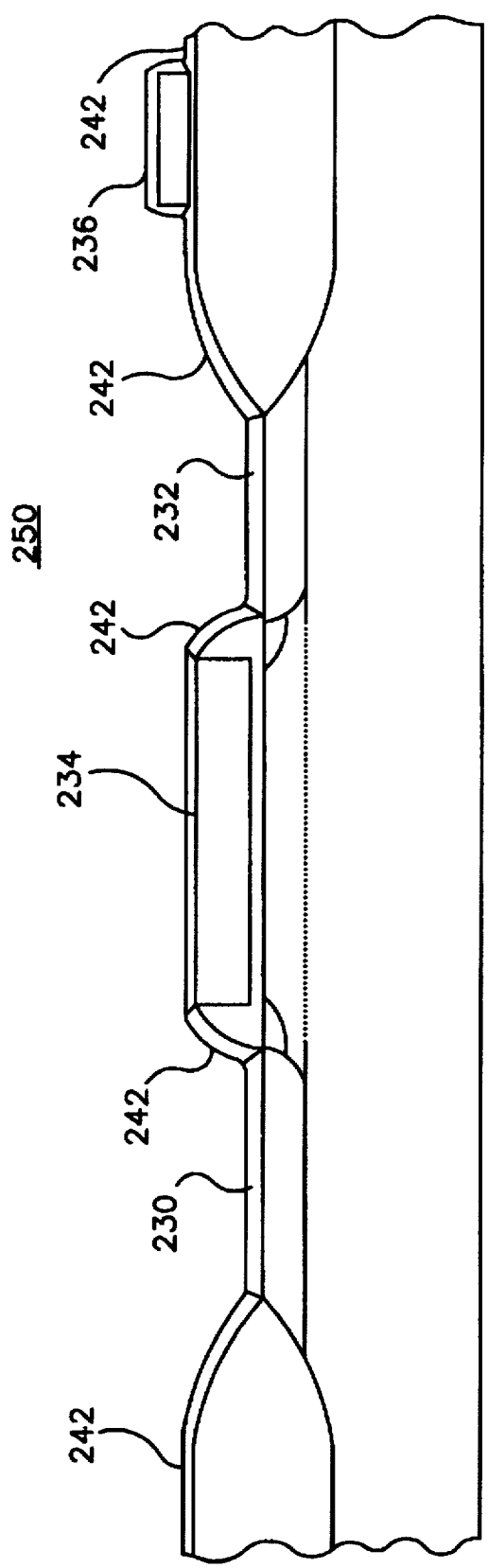

In FIG. 2C, there is shown a semiconductor structure 250 formed by annealing structure 240 of FIG. 2B. In the preferred embodiment of the present invention, annealing is typically done using rapid thermal processing techniques in which structure 240 is heated to temperatures between about 600° C. and about 800° C. for between about 10 and 60 seconds.

Refractory metal silicide layers 230, 232, 234, 236 are produced over source 212, drain 213, polysilicon gate 214, and polysilicon interconnect 216, respectively. Refractory metal layers 242 of FIG. 2B over gate and field oxides 220, 222 remain unaffected, since silicon bound up in the silicon oxides of gate and field oxides 220, 222, does not react with refractory metal layer 242 under annealing conditions.

Figure 2D:
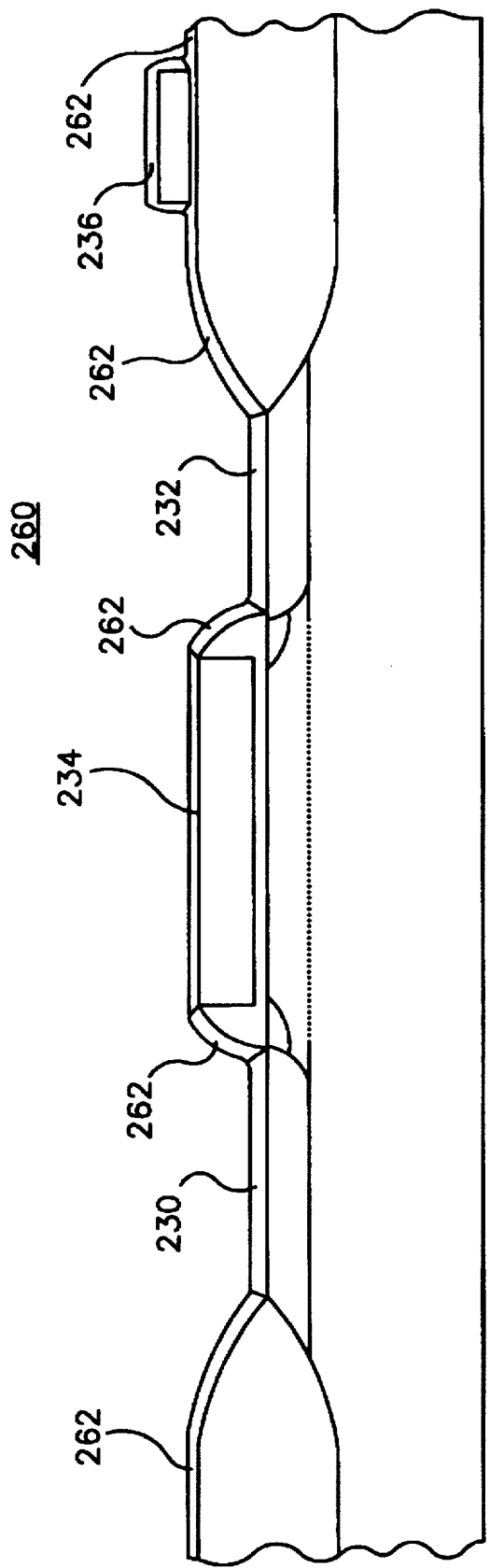

Referring now to FIG. 2D, there is shown a semiconductor structure 260 formed by oxidizing semiconductor structure 250 of FIG. 2C. Refractory metal silicide layers 230, 232, 234, 236 are unaffected by the oxidation, while refractory metal layer 242 of FIG. 2C is oxidized to form refractory metal oxide layer 262.

Structure 250 is oxidized by heating it to between 400° C. and 900° C. and exposing the heated structure 250 to an oxidizing agent under either wet or dry conditions. In the preferred embodiment, structure 250 is heated to between 500° C. and 600° C. and exposed to $O_2$ under wet conditions. The duration of the oxidation step depends on the thickness of the film. For a typical 300 Å thick titanium metal layer 242, structure 250 is oxidized for approximately 10 to 15 minutes. Metal oxide layers 262 form an etch stop which is not attacked by contact etching in a subsequent step, protecting gate and field oxides 220, 222, respectively.

Figure 3:
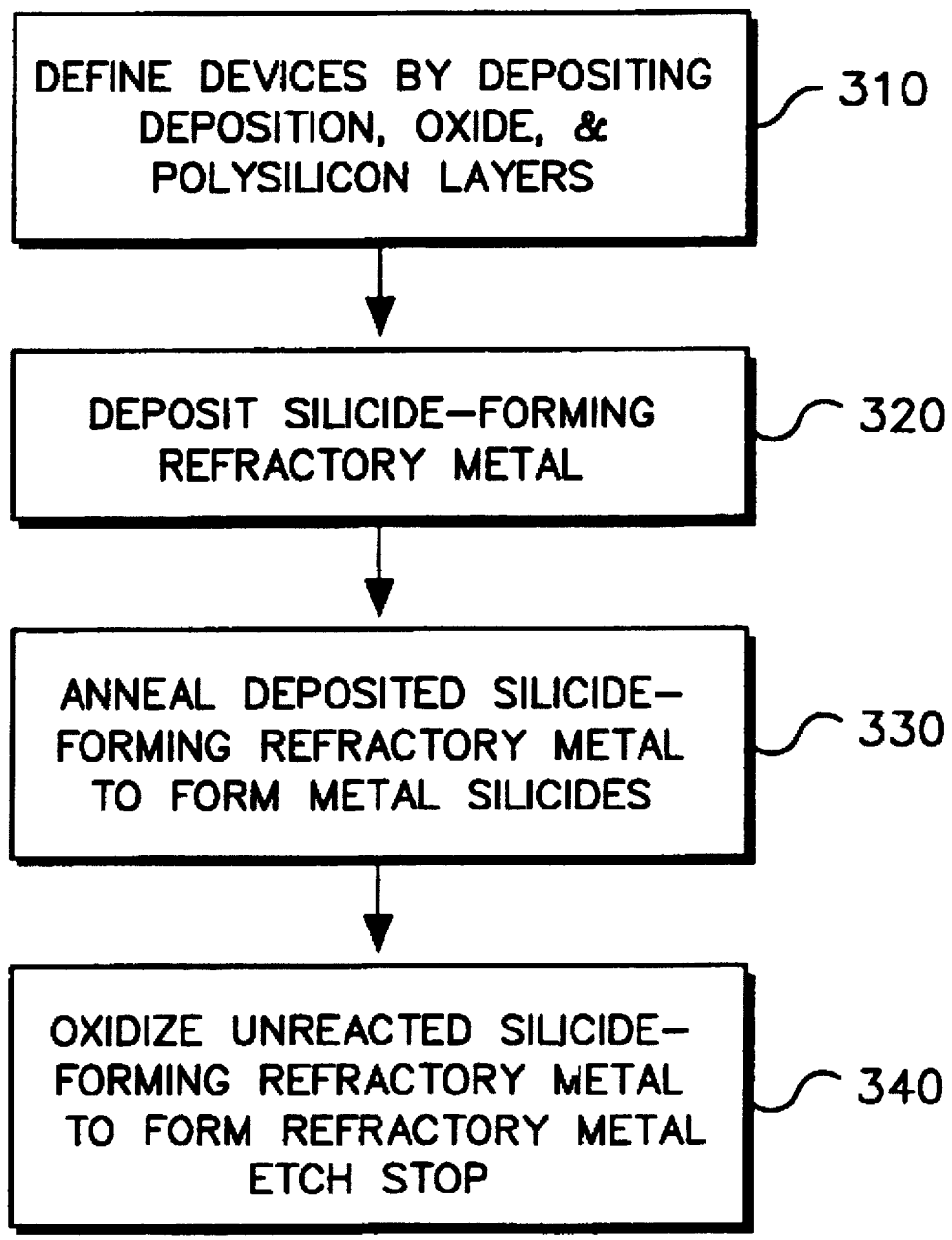
FIG. 3 is a flow chart representing the steps of a semiconductor fabrication process in accordance with the present invention.

Referring now to FIG. 3, there is shown a flow chart summarizing the method for producing etch-stop layer 262 of FIG. 2D in accordance with the present invention. At step 310, deposition, oxide, and polysilicon layers 202, 204, 206 of FIGS. 2A–2D are formed using well-known methods. A layer 242 of silicide-forming refractory metal is then deposited 320 over the exposed surfaces of deposition, oxide, and polysilicon layers 202, 204, 206 to form coated structure 240. Annealing 330 structure 240 following deposition 320 of the silicide-forming refractory metal layer 242 produces refractory metal silicide layers 230, 232, 234, 236 over source 212, drain 213, polysilicon gate 214, and polysilicon interconnects 216, respectively. Oxidizing 340 unreacted refractory metal layer 242 then forms refractory metal oxide layers 262 over gate and field oxides 220, 222. Refractory metal oxide layers 262 act as an etch stop to prevent overetching of the underlying oxide layers.

Therefore, a method has been presented for forming etch stop layers over semiconductor structures without the need for additional etching, masking, and deposition steps. A refractory metal capable of forming silicides and oxides under standard processing conditions is deposited over the deposition, oxide, and polysilicon layers which define the gates, sources, drains and device structures of a MOS integrated circuit. Annealing forms refractory metal silicide layers over unoxidized silicon structures, and subsequent oxidation forms refractory metal oxide layers over silicon dioxide structures.

I claim:

1. A method for forming an etch-stop during the processing of an integrated circuit subsequent to the formation of polysilicon gate, source, drain, polysilicon interconnect, gate oxide, and field oxide regions, the method comprising:

depositing a silicide-forming refractory metal over a semiconductor structure including polysilicon gate, source, drain, polysilicon interconnect, gate oxide, and field oxide regions to form a coated structure, the deposited refractory metal contacting previously exposed surfaces of the gate, interconnect, and field oxide regions;

annealing the coated structure to form a silicided structure having refractory metal-silicide layers in contact with the previously exposed surfaces of the gate and interconnect regions; and after the step of annealing the coated structure, oxidizing the silicided structure to form refractory metal oxide layers in contact with the previously exposed surfaces of the field oxide region, whereby the refractory metal oxide layers act as etch-stops which protect the field oxide regions during the processing of the integrated circuit.

2. The method of claim 1, wherein the depositing step is a chemical vapor deposition step.

3. The method of claim 1, wherein the depositing step is a sputter deposition step.

4. The method of claim 1, wherein the depositing step is an electron beam deposition step.

5. The method of claim 1, wherein the depositing step is an evaporation deposition step.

6. The method of claim 1, wherein the annealing step comprises heating the coated structure to between approximately 600° C. and 800° C. for between approximately 10 seconds and 60 seconds.

7. The method of claim 5, wherein the oxidizing step comprises the substeps of:

heating the coated structure to between approximately 400° C. and 900° C.; and exposing the heated, coated structure to an oxidizing agent.

8. The method of claim 1, wherein the depositing step comprises depositing a silicide-forming refractory metal selected from the group consisting of: cobalt, hafnium, molybdenum, nickel, palladium, platinum, tantalum, titanium, tungsten, and zirconium.

9. The method of claim 7, wherein the silicide-forming refractory metal is titanium.

10. The method of claim 7, wherein the oxidizing agent is oxygen.

* * * * *